United States Patent [19]

Igarashi

[11] Patent Number: 5,038,199
[45] Date of Patent: Aug. 6, 1991

[54] CONNECTION TERMINAL OF SEMICONDUCTOR DEVICE

[75] Inventor: Takashi Igarashi, Itami, Japan

[73] Assignee: Mitsubishi Denki Kabushiki Kaisha, Tokyo, Japan

[21] Appl. No.: 412,498

[22] Filed: Sep. 26, 1989

[30] Foreign Application Priority Data

Jun. 20, 1989 [JP] Japan .................................. 1-158947

[51] Int. Cl.⁵ .......................................... H01L 23/48
[52] U.S. Cl. ...................................... 357/81; 357/65; 357/68; 439/849; 439/843; 439/819
[58] Field of Search ............................ 357/81, 65, 68; 439/849, 843, 819, 846, 912

[56] References Cited

U.S. PATENT DOCUMENTS 3,228,207  1/1966  Hartmann, Jr. et al. ............ 439/849
4,617,585 10/1986  Yasui ..................................... 351/68
4,621,422 11/1986  Neumann et al. ................... 439/843

FOREIGN PATENT DOCUMENTS 54-161095 12/1979 Japan ................................... 439/849

Primary Examiner—Eugene R. LaRoche
Assistant Examiner—R. Ratliff
Attorney, Agent, or Firm—Oblon, Spivak, McClelland, Maier & Neustadt

[57] ABSTRACT

The present invention relates to a connection terminal of a semiconductor device having a circuit in a case. The connection terminal of the semiconductor device according to the present invention has a construction in which a male terminal includes a plurality of terminal pieces separated from each other by a slit, and the terminal pieces are individually electrically connected to parts of the circuit. When a characteristic evaluation test is carried out with regard to the circuit, the parts of the circuit can be individually evaluated by touching the terminal pieces with test terminals such as probes. Additionally, in a practical use of the semiconductor device, one female terminal can short-circuit the plurality of the terminal pieces. Accordingly, the number of the terminals can be reduced to accomplish a compact device.

8 Claims, 8 Drawing Sheets

5,038,199

CONNECTION TERMINAL OF SEMICONDUCTOR DEVICE

BACKGROUND OF THE INVENTION

1. Field of the Invention

The present invention relates to a connection terminal of a semiconductor device having a circuit in a case.

2. Description of the Related Art

As a conventional semiconductor device, there is such a semiconductor device as connection terminals thereof are individually used when parts of a circuit contained in a case are evaluated in characteristic, while the same are used with short-circuited each other when the semiconductor device is properly used (referred to as "a practical use" below).

FIGS. 12 to 15 are views showing such conventional connection terminals of a semiconductor device. FIG. 12 is a plan view showing the connection terminals before connection in a practical use, FIG. 13 is a plan view of the connection terminals after connection in a practical use, FIG. 14 is a perspective view of FIG. 12, and FIG. 15 is a sectional view taken along the line A—A of FIG. 13. As shown in these figures, a semiconductor device Ī is provided with a plurality of male terminals 2a, 2b, ... projecting outward from a side wall of a case 1. The male terminals 2a, 2b, ... are electrically connected individually to parts of a circuit (not shown) provided in the case 1. In these figures, however, two male terminals 2a and 2b are conveniently shown, and illustration of other male terminals is omitted. Each of the male terminals 2a, 2b, ... has a hole 3 in its center and has a difference in width to make stoppers 4 on the both side edges.

On the other hand, female terminals 5a, 5b, ... for a practical use are provided corresponding to the male terminals 2a, 2b, .... Two female terminals 5a and 5b, for example, are mutually short-circuited by a wire 6. Each of the female terminals 5a, 5b, ... includes a center piece 7, spring pieces 8 extended so as to be curved inwardly from the both sides of the center piece 7 and a projection 9 provided on the upper surface of the center piece 7.

In the semiconductor device Ī having the connection terminals structured as stated above, a characteristic evaluation of the circuit contained in the case 1 is carried out by using an evaluation test device 10 as shown in FIG. 16, for example. First, the semiconductor device Ī is positioned on a stage 12 by a positioning member 11. Then a probe supporting plate 13 is lowered so that the tips of probes 14a, 14b, ... come in contact with the male terminals 2a, 2b, ..., respectively. In the case that a part of the circuit connected to the male terminal 2a is evaluated in the characteristic under the circumstance, a signal is transmitted between the part of the circuit and a tester (not shown) through the probe 14a connected to the male terminal 2a. Similarly, in the case that a part of the circuit connected to the male terminal 2b is evaluated in the characteristic, a signal is transmitted between the part of the circuit and the tester (not shown) through the probe 14b.

When the semiconductor device Ī whose characteristic evaluation test in each part of the circuit is completed is practically used, the male terminals 2a, 2b, ... are connected to the female terminals 5a, 5b, ... as shown in FIG. 13. As a result, the semiconductor device Ī is used in such situation as the male terminals 2a and 2b are short-circuited through the female terminals 5a and 5b and the wire 6. In this case, when the male terminals 2a, 2b, ... are inserted to the female terminals 5a, 5b, ..., the leading edges of the spring pieces 8 are engaged with the stoppers 4 to control the insertion amount in the female terminals 5a, 5b, ..., and further, the projection 9 is engaged with the hole 3 to prevent the female terminals 5a, 5b, ... from coming off the male terminals 2a, 2b, .... Spring force of the spring pieces 8 makes the spring pieces 8 of the female terminals 5a and 5b and the center piece 7 hold the male terminals 2a, 2b, ... therebetween, and the male terminals 2a, 2b, ... and the female terminals 5a, 5b, ... are connected in a good contact.

As has been described, in the conventional construction of the connection terminal of the semiconductor device, a plurality of the male terminals 2a and 2b are provided allowing for characteristic evaluation of each part of the circuit contained in the case 1, while in a practical use, a plurality of the female terminals 5a and 5b which are short-circuited by the wire 6 are provided corresponding to the male terminals 2a and 2b. Therefore, the conventional connection terminal has a disadvantage that the number of terminals are increased to make the device large.

SUMMARY OF THE INVENTION

The present invention relates to a connection terminal of a semiconductor device having a circuit in a case. The connection terminal of the semiconductor device according to the present invention comprises a male terminal projecting out of the case, and a female terminal which can be connected to the male terminal, the male terminal including a plurality of terminal pieces separated from each other by a slit, the terminal pieces being shaped so as to be electrically connected to the female terminal in common, and the terminal pieces being electrically connected individually to the circuit.

Accordingly, it is a major object of the present invention to provide a connection terminal of a semiconductor device, whose terminals are reduced in number to accomplish a compact device.

The connection terminal of the semiconductor device according to the present invention has a construction in which a male terminal includes a plurality of terminal pieces separated from each other by a slit, and the terminal pieces are individually electrically connected to parts of the circuit. When a characteristic evaluation test is carried out, the parts of the circuit can be individually evaluated by touching the terminal pieces with test terminals such as probes respectively. Additionally, in a practical use of the semiconductor device, one female terminal can contact with the plurality of the terminal pieces to cause the terminal pieces to short-circuit each other. Accordingly, the number of the terminals can be reduced to accomplish a compact device.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
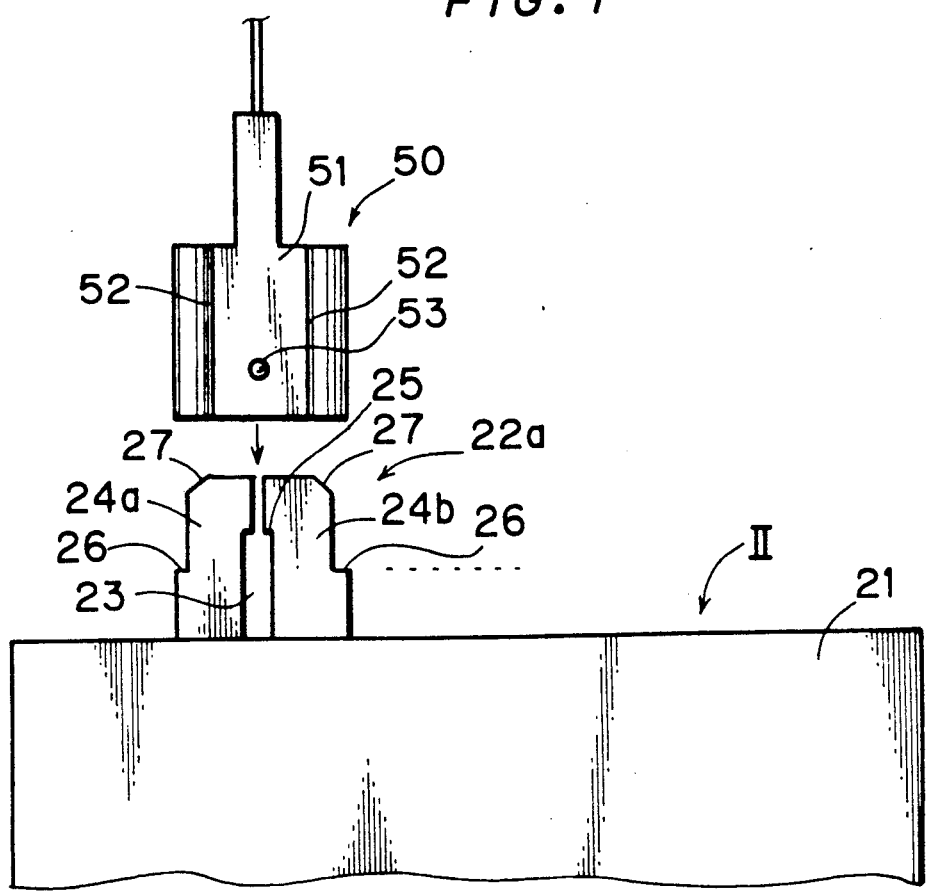
FIGS. 1 and 2 are plan views showing a first embodiment of a connection terminal of a semiconductor device according to the present invention, respectively.
Figure 2:
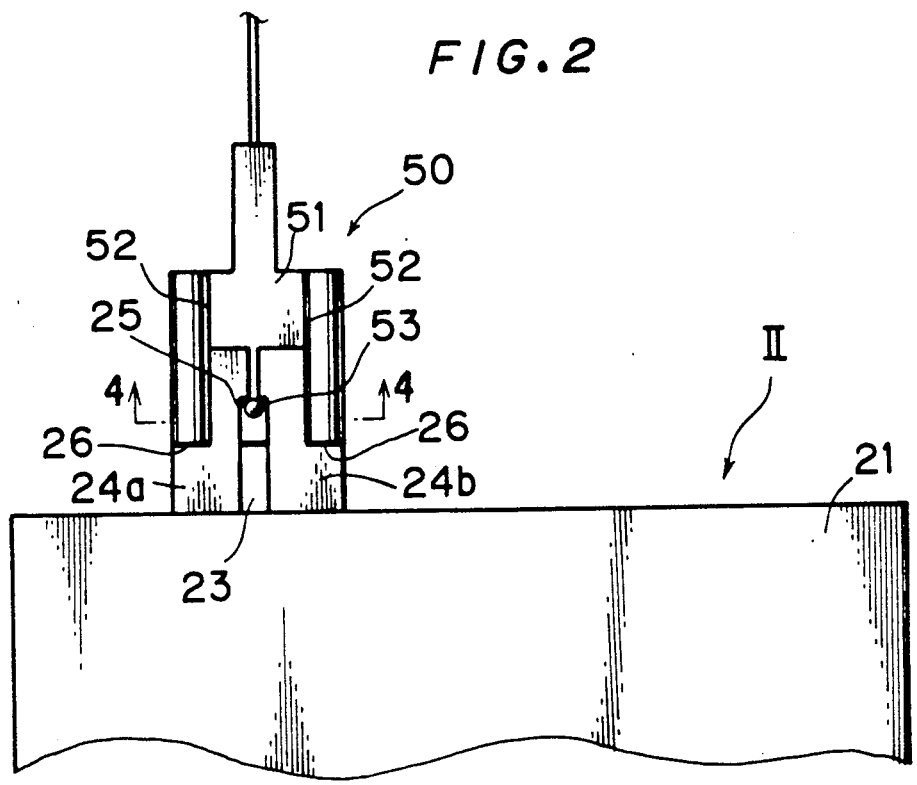
Figure 3:
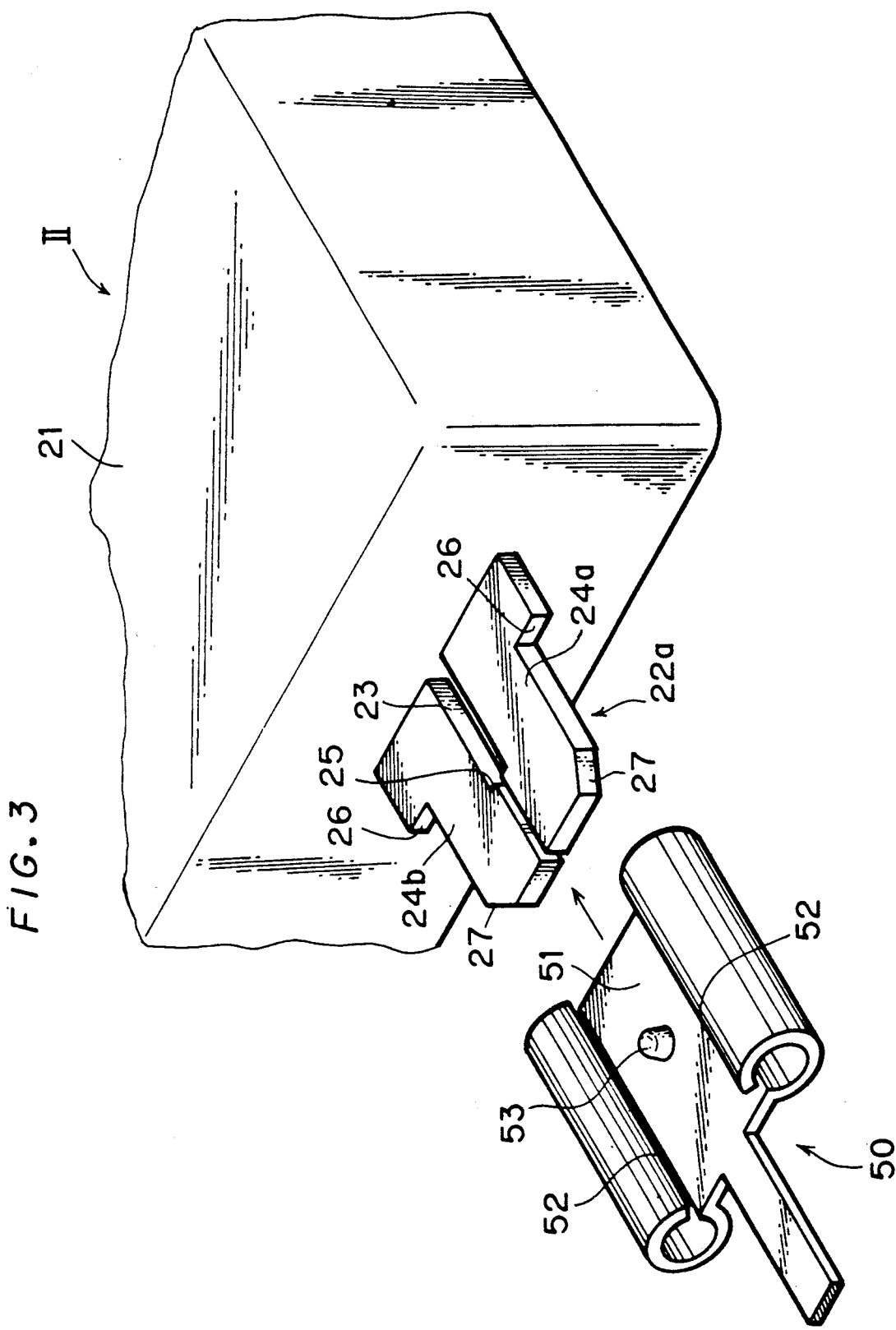
FIG. 3 is a perspective view showing a main portion of FIG. 1.
Figure 4:
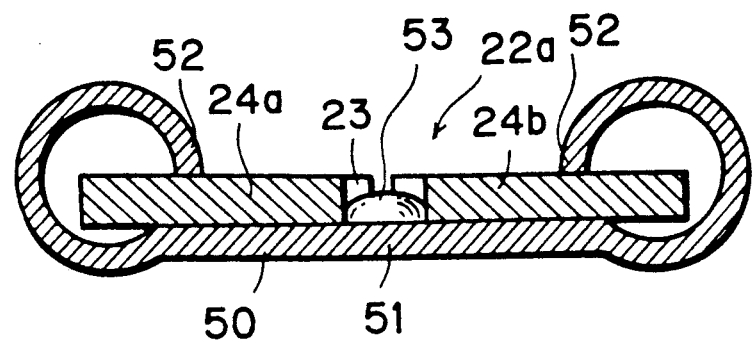
FIG. 4 is a sectional view taken along the line B—B of FIG. 2.

FIGS. 1 to 4 are views showing a first embodiment of a connection terminal of a semiconductor device according to the present invention, respectively. FIG. 1 is a plan view showing the connection terminal before connection in a practical use, FIG. 2 is a plan view showing the connection terminal after connection in a practical use, FIG. 3 is a perspective view of a main portion of FIG. 1, and FIG. 4 is a sectional view taken along the line B—B of FIG. 2. As shown in these figures, a semiconductor device II is provided with a plurality of male terminals 22a extending outward from a side wall of a case 21. Conveniently, only one male terminal 22a is shown in the figures while others are omitted.

Figure 12:
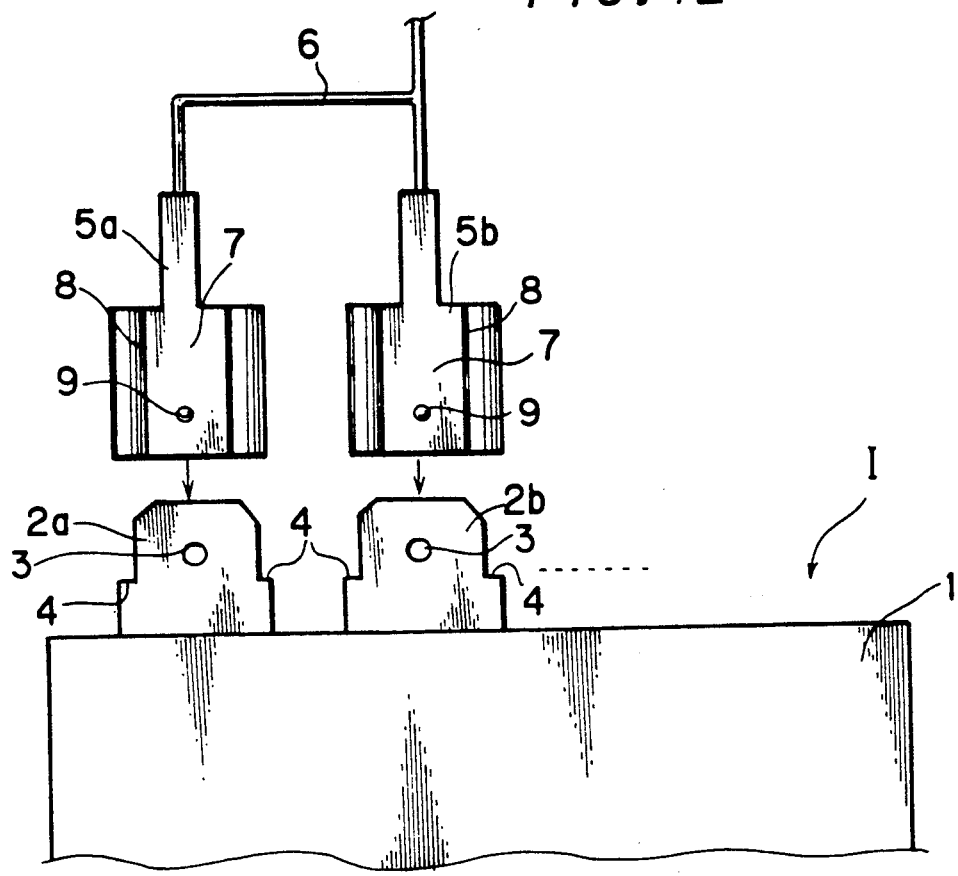
FIGS. 12 and 13 are plan views showing a conventional connection terminal of a semiconductor device, respectively.
Figure 13:
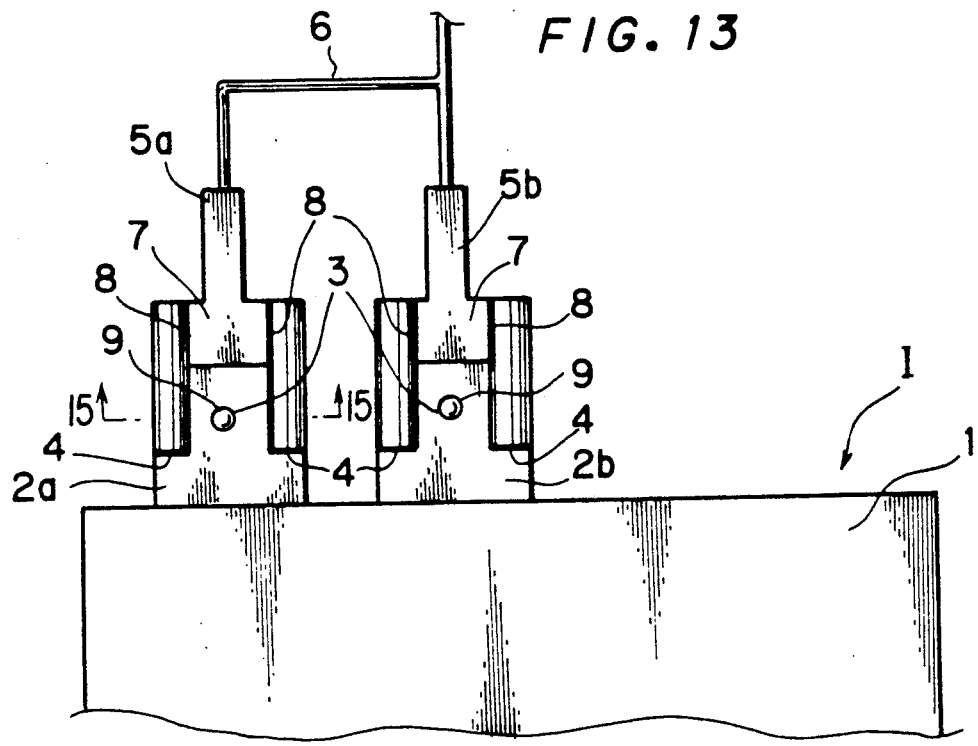
Figure 14:
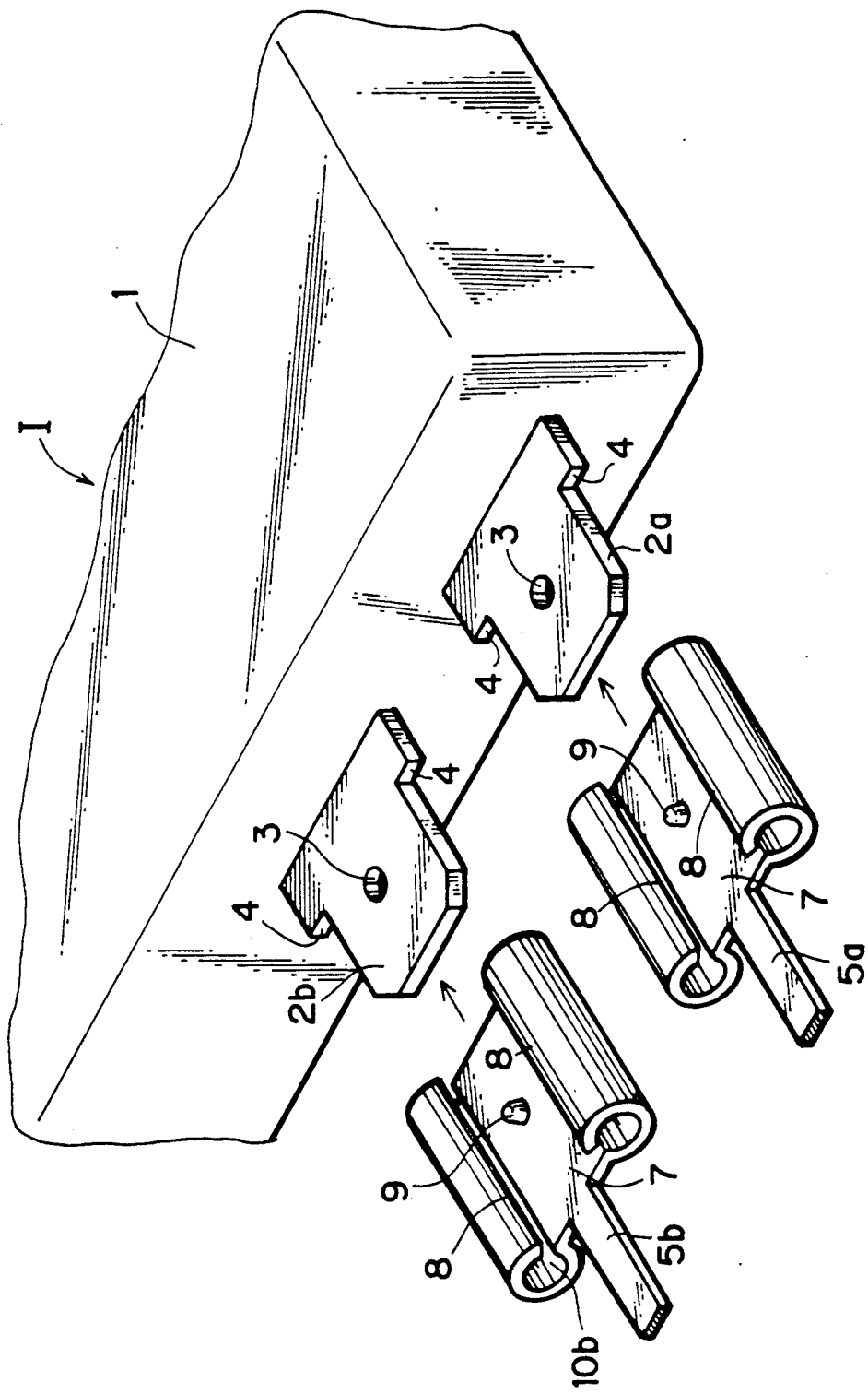
FIG. 14 is a perspective view of a main portion of FIG. 12.
Figure 15:
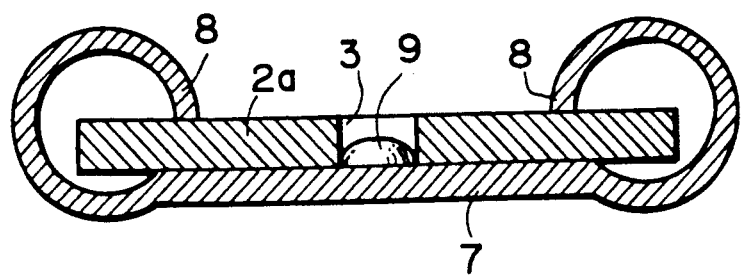
FIG. 15 is a sectional view taken along the line A—A of FIG. 13.
Figure 16:
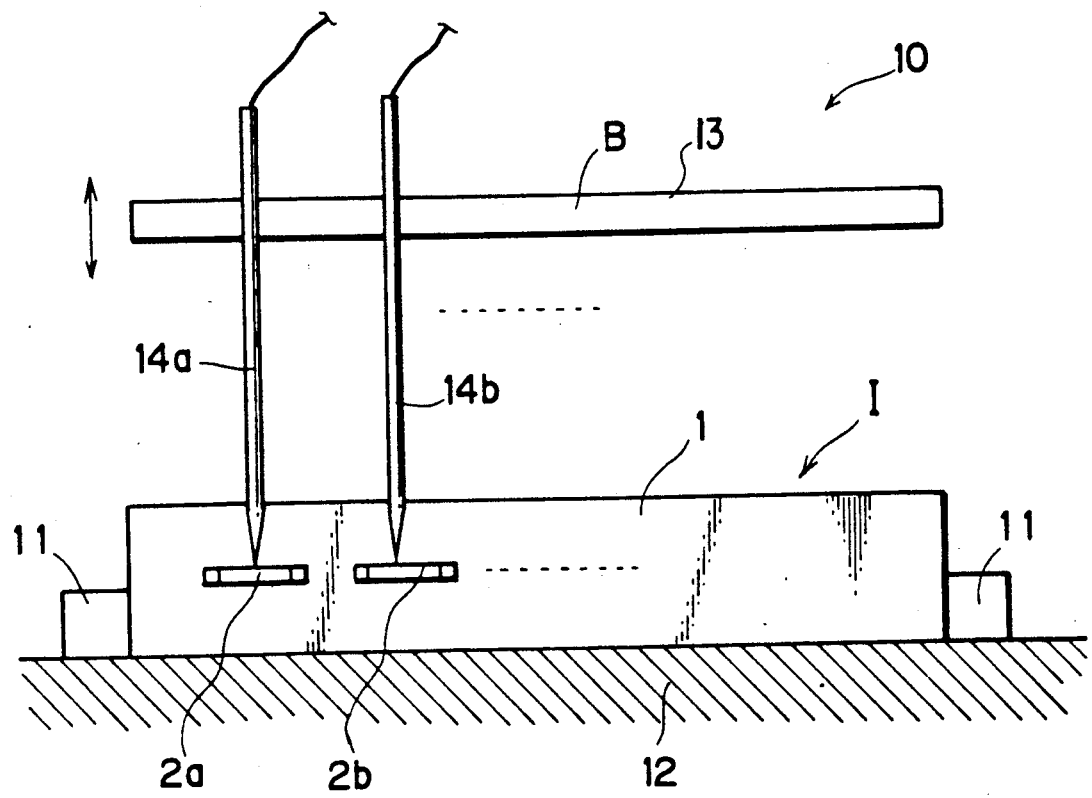
FIG. 16 is a schematic side view showing a conventional evaluation test device.

A female terminal 50 for a practical use has the same construction as conventional female terminals 5a and 5b (FIG. 12). Namely, the female terminal 50 includes a center piece, spring pieces 52 extended so as to be curved inwardly from the both sides of the center piece 51, and a projection 53 provided on the upper surface of the center piece 51.

The male terminal 22a, which can be connected to the female terminal 50, includes a pair of terminal pieces 24a and 24b separated from each other by a slit 23. The slit 23 almost linearly extends in the center of the male terminal 22a in a direction in which the male terminal 22a is put in the female terminal 50. The slit 23 has a difference in width to form a portion 25 capable of engaging with the projection 53. The male terminal 22a has a difference in width to make stoppers 26 on the both side edges thereof. The corners of the top end of the male terminal 22a are cut to make tapered insertion guide edges 27. Thus, the terminal pieces 24a and 24b are symmetrically formed with the slit 23 interposed therebetween. The terminal pieces 24a and 24b are electrically connected individually to parts of a circuit (not shown) contained in the case 21.

Figure 5:
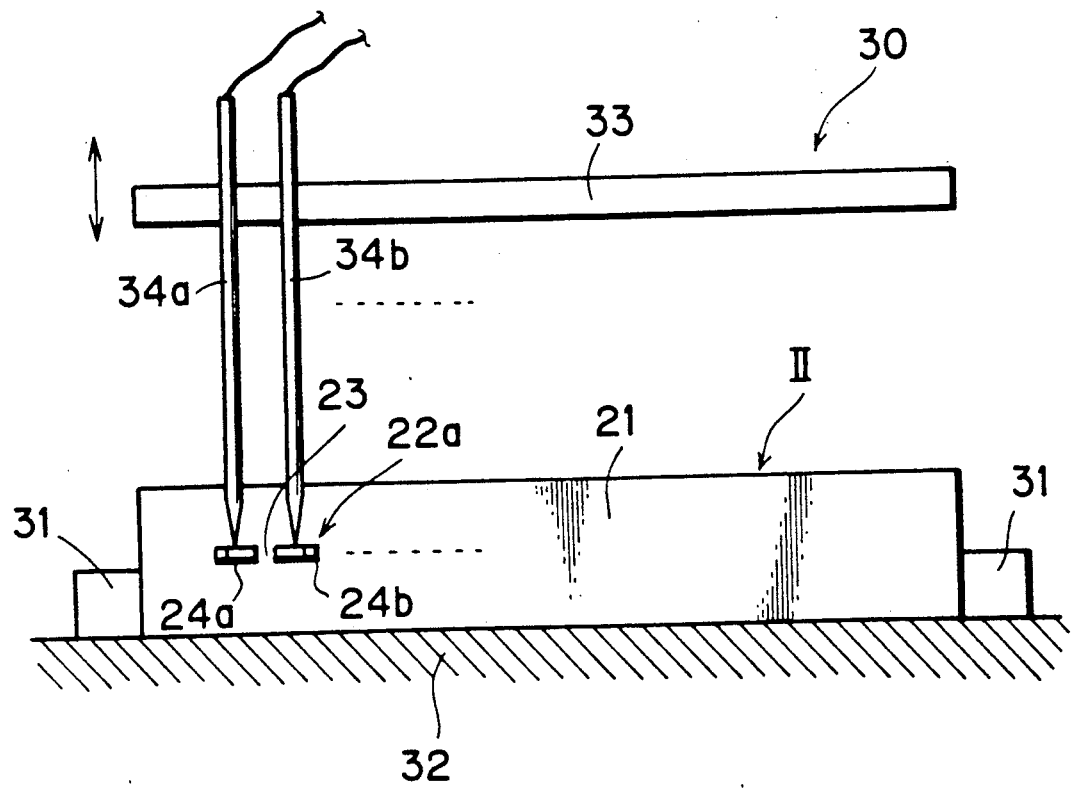
FIG. 5 is a schematic view showing an evaluation test device employed for the first embodiment.

In the semiconductor device II having the connection terminal constructed as stated above, a characteristic evaluation of the circuit contained in the case 21 is carried out by using an evaluation test device 30 as shown in FIG. 5, for example. First, the semiconductor device II is positioned on a stage 32 by a positioning member 31. Then a probe supporting plate 33 is lowered so that the tips of probes 34a, 34b, ... come in contact with the terminal pieces 24a, 24b, ..., respectively. In the case that a part of the circuit connected to the terminal piece 24a is evaluated in the characteristic under the circumstance, a signal is transmitted between the part of the circuit and a tester (not shown) through the probe 34a connected to the terminal piece 24a. Similarly, in the case that a part of the circuit connected to the terminal piece 24b is evaluated in the characteristic, a signal is transmitted between the part of the circuit and the tester (not shown) through the probe 34b connected to the terminal piece 24b. Thus, the parts of the circuit contained in the case 21 can be individually evaluated.

When the semiconductor device II is practically used, the male terminals 22a, ... are connected to the female terminals 50, .... Namely, when the male terminals 22a, ... are inserted to the female terminals 50, ..., the leading edges of the terminal pieces 24a and 24b of the male terminal 22a are inserted to a gap defined by the spring pieces 52 and the center piece 51, pushing aside the spring pieces 52. In this case, even when the female terminal 50 is put to the male terminal 22a somewhat out of position, the tapered insertion guides 27 which are provided on the leading edges of the terminal pieces 24a and 24b correct the deviation so that the female terminal 50 can be put accurately in position to the male terminal 22a. When the female terminal 50 is push until its leading edge engages with the stoppers 26, the projection 53 is engaged with the portion 25 of the male terminal 22a so as to prevent the female terminal 50 from coming off. In this circumstance, spring force of the spring pieces 52 of the female terminal 50 makes the spring pieces 52 and the center piece 51 hold the terminal pieces 24a and 24b therebetween, and the female terminal 50 is connected to the terminal pieces 24a and 24b in a good contact. Accordingly, the semiconductor device II is practically used in such situation as the terminal pieces 24a and 24b of the male terminal 22a are short-circuited by the female terminal 50.

In the connection terminal of the semiconductor device, the male terminal 22a includes the pair of the terminal pieces 24a and 24b separated from each other by the slit 23 and the terminal pieces 24a and 24b are electrically connected individually to the parts of the circuit. Therefore, in a characteristic evaluation test, the parts of the circuit can be individually evaluated by touching the terminal pieces 24a and 24b with test terminals such as probes, while in a practical use, one female terminal 50 can be connected to a plurality of the terminal pieces 24a and 24b to cause the terminal pieces 24a and 24b to short-circuit each other. As a result, a number of male terminals can be reduced to obtain a compact device compared to a conventional device. Additionally, a reduced number of the connection terminals causes decrease in contact points of the male and female terminals, so that imperfect contact of the connection terminals can be avoided and it leads to improvement of reliability of the device.

Figure 6:
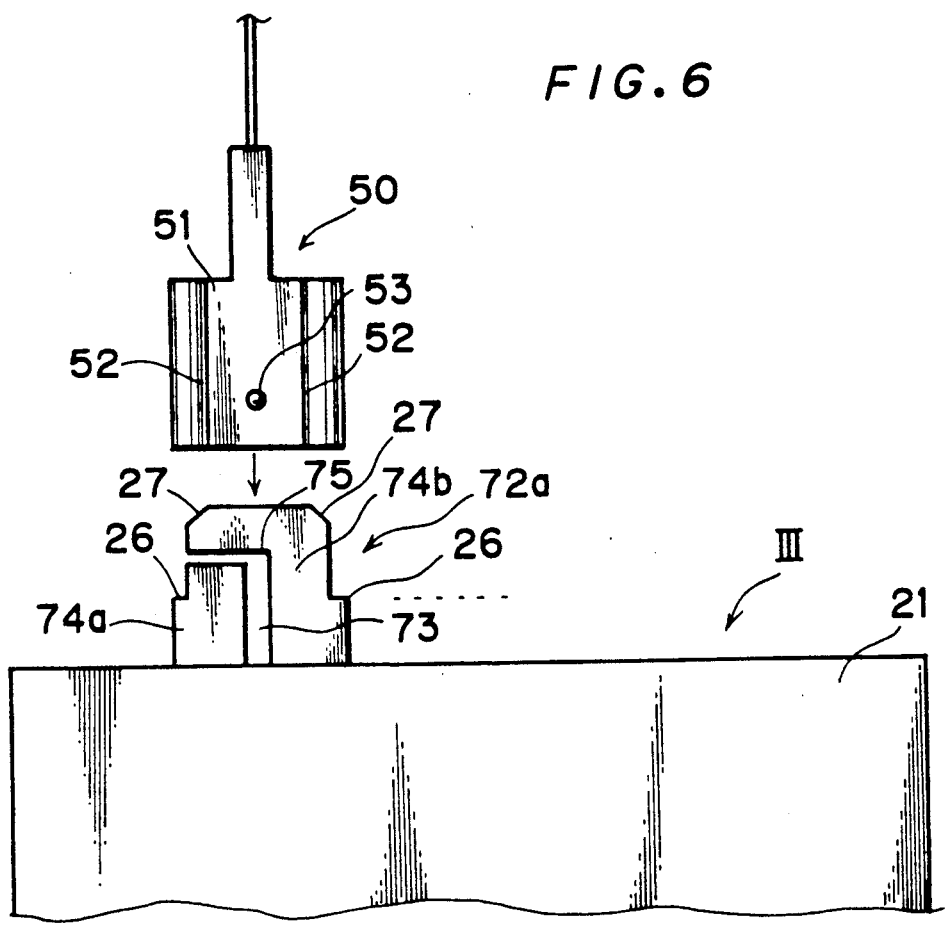
FIGS. 6 and 7 are plan views showing a second embodiment of a connection terminal of a semiconductor device according to the present invention, respectively.
Figure 7:
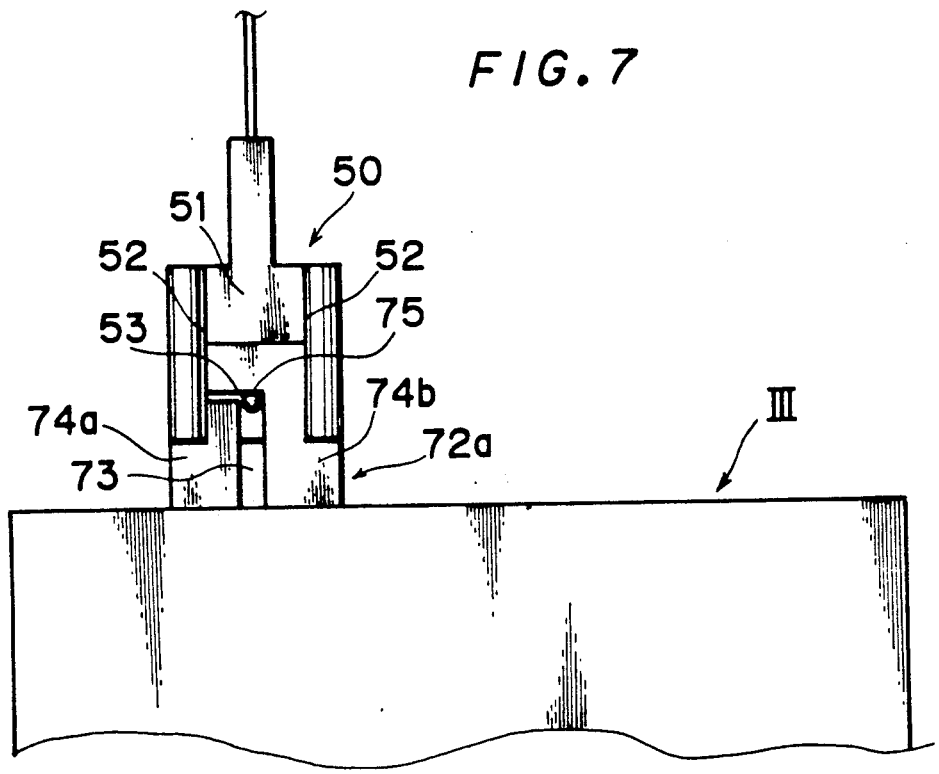

FIGS. 6 and 7 show plan views showing a main portion of a second embodiment of a connection terminal of a semiconductor device according to the present invention. As shown in these figures, a male terminal 72a of the semiconductor device III has an L-shaped slit 73, and an area of one terminal piece 74b is larger than that of the other terminal piece 74a separated from the terminal piece 74b by the slit 73. The male terminal 72a is provided with a portion 75 which can be engaged with the projection 53 of the female terminal 50, in a region of the terminal piece 74b corresponding to the turning part of the slit 73. Other parts of this embodiment are similar to those of the above first embodiment, so that like or corresponding parts are represented with like reference numerals and the explanation is omitted.

In the semiconductor device III, an area of the terminal piece 74b is larger than that of the terminal piece 74a, so that the contact area of the terminal piece 74b with respect to the female terminal 50 is larger than the contact area of the terminal piece 74a with respect to the female terminal 50 when the female terminal 50 is connected to the male terminal 72a as shown in FIG. 7. In other words, the contact resistance between the terminal piece 74b and the female terminal 50 is smaller than that between the terminal piece 74a and the female terminal 50, so that it is useful in a practical use of a case where a large current flows in the terminal piece 74b while a small current flows in the terminal piece 74a. Accordingly, the ratio of the area of the terminal piece 74a to that of the terminal piece 74b is desirably determined to correspond to the ratio of the currents flowing in both the terminal pieces 74a and 74b.

Figure 8:
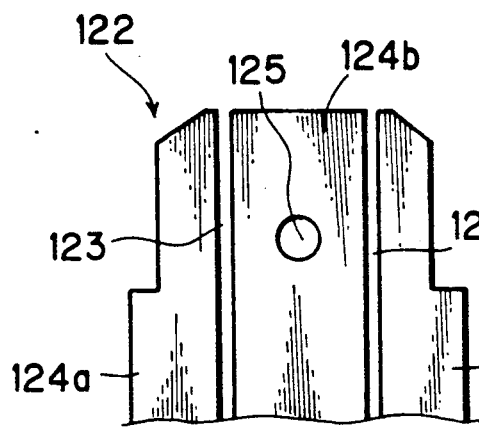
FIGS. 8 to 10 are plan views showing modified examples of male terminals, respectively.

In the above first and second embodiments, although the male terminals 22a and 72a include the two terminal pieces 24a, 24b and 74a, 74b, respectively, they may be include three or more terminal pieces as required. As shown in FIG. 8, for example, a male terminal 122 may include three terminal pieces 124a, 124b and 124c separated from each other by two almost linear slits 123 which are disposed in parallel. In this case, the center terminal piece 124b is provided with a hole 125. When the male terminal 122 and the female terminal 50 are connected, the projection 53 of the female terminal 50 is engaged with the hole 125, and the side terminal pieces 124a and 124c are held by the spring pieces 52 and the center piece 51 with the center terminal piece 124b being in contact with the center piece 51.

Figure 9:
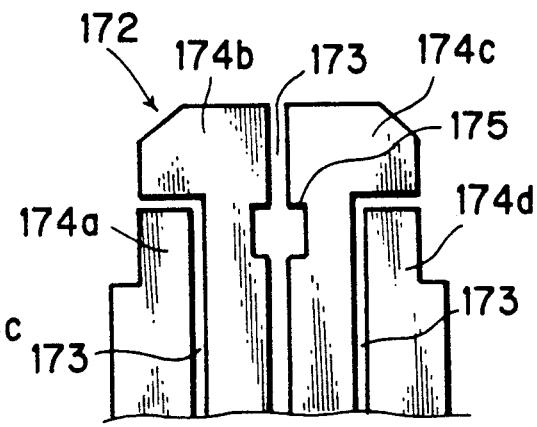

As shown in FIG. 9, a male terminal 172 may include four terminal pieces 174a, 174b, 174c and 174d separated from each other by an almost linear center slit 173 and almost L-shaped slits 173 disposed on the both sides thereof. In this case, the center slit 173 has a portion 175 whose width is larger than other portion in its thorough extension. When the male terminal 172 and the female terminal 50 are connected, the projection 53 of the female terminal 50 is engaged with the portion 175, and the terminal pieces 174a and 174b on one side are held by one of the spring pieces 52 and the center piece 51 while the remaining two terminal pieces 174c and 174d on the other side are held by the other spring piece 52 and the center piece 51.

Figure 10:
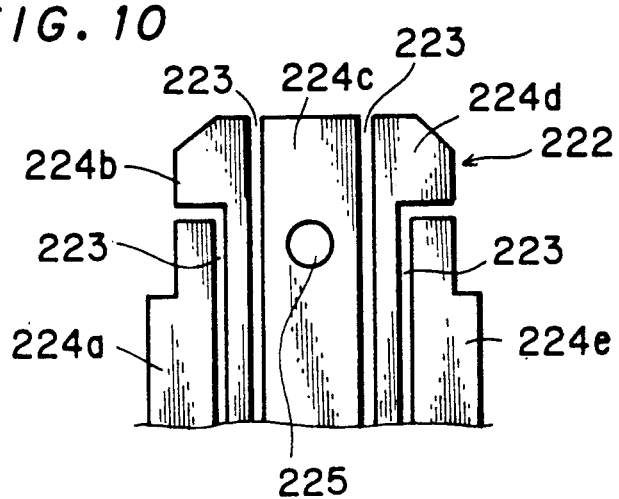

As shown in FIG. 10, a male terminal 222 may include five terminal pieces 224a, 224b, 224c, 224d and 224e separated from each other by two almost linear center slits 223 disposed in parallel and two almost L-shaped slits 223 disposed on both sides thereof. In this case, the center terminal piece 224c is provided with a hole 225. When the male terminal 222 and the female terminal 50 are connected, the projection 53 of the female terminal 50 is engaged with the hole 225, and the terminal pieces 224a and 224b on one side are held by one of the spring pieces 52 and the center piece 51 while the terminal pieces 224d and 224e are held by the other spring piece 52 and the center piece 51, with the center terminal piece 224c being in contact with the center piece 51.

Figure 11:
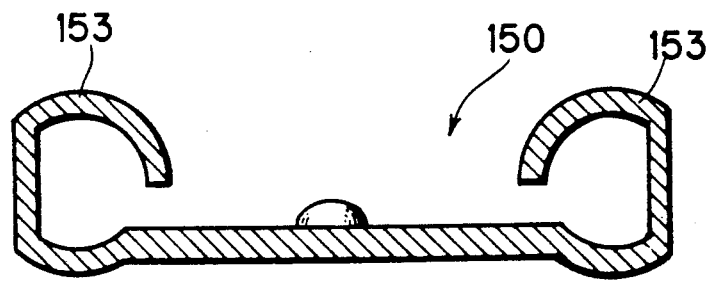
FIG. 11 is a sectional view showing a modified example of a female terminal.

The female terminal 50 applied to the above embodiments has the spring pieces 52 formed with an arc cross section as shown in FIG. 4. However, as shown in FIG. 11, a female terminal 150 whose spring pieces 153 are formed with arc portions and a straight portion being combined may be applied.

The foregoing description of the preferred embodiment of the present invention has been presented for purposes of illustration and description. It is not intended to be exhaustive or to limit the invention to the precise form disclosed. Obviously, many modifications and variations will be apparent to those skilled in the art. The scope of the invention can be defined by the claims appended hereto and their equivalents.

What is claimed is:

1. A connection terminal of a semiconductor device having a circuit in a case comprising a plurality of parts of said circuit, said connection terminal comprising:
    a male terminal projecting out of said case; and
    a female terminal which can be connected to said male terminal;
    said male terminal including a plurality of terminal pieces electrically separated from each other by a slit, said terminal pieces being shaped so as to be electrically connected to said female terminal in common, and said terminal pieces being electrically connected individually to each of said plurality of parts of said circuit.

2. A connection terminal of a semiconductor device according to claim 1, wherein said terminal pieces are separated by said slit so that contact areas of said terminal pieces with respect to said female terminal are identical with each other.

3. A connection terminal of a semiconductor device according to claim 1, wherein said terminal pieces are separated by said slit so that contact areas of said terminal pieces with respect to said female terminal are different from each other.

4. A connection terminal of a semiconductor device according to claim 1, wherein said female terminal includes a projection, and said slit of said male terminal has a portion with which said projection of said female terminal can be engaged.

5. A connection terminal of a semconductor device according to claim 1, wherein said female terminal includes a center piece and two spring pieces extended so as to be curved inwardly from the both sides of said center piece, and said male terminal includes two terminal pieces separated from each other by an almost linear slit,
    when said male terminal and said female terminal are connected, said terminal pieces being held by said spring pieces and said center piece, respectively.

6. A connection terminal of a semiconductor device according to claim 1, wherein said female terminal includes a center piece and two spring pieces extended so as to be curved inwardly from the both sides of said center piece, and said male terminal includes three terminal pieces electrically separated from each other by two almost linear slits disposed in parallel,
    when said male terminal and said female terminal are connected, the center terminal piece being in contact with said center piece while the terminal pieces on the both sides of said center terminal piece are held by said spring pieces and said center piece, respectively.

7. A connection terminal of a semiconductor device according to claim 1, wherein said female terminal includes a center piece and two spring pieces extended so as to be curved inwardly from the both sides of said center piece, and said male terminal includes four terminal pieces electrically separated from each other by an almost linear center slit and almost L-shaped slits disposed on the both sides of said center slit, when said male terminal and said female terminal are connected, two of said terminal pieces on one side being held by one of said spring pieces and said center piece while the remaining two terminal pieces are held by the other spring piece and said center piece.

8. A connection terminal of a semiconductor device according to claim 1, wherein said female terminal includes a center piece and two spring pieces extended so as to be curved inwardly from the both sides of said center piece and said male terminal includes five terminal pieces electrically separated from each other by two almost linear center slits disposed in parallel and two almost L-shaped slits disposed on the both sides of said center slits, when said male terminal and said female terminal are connected, the center terminal piece being in contact with said center piece while two of the terminal pieces on one side are held by one of said spring pieces and said center piece and the remaining two terminal pieces are held by the other spring piece and said center piece.

* * * * *